United States Patent
Dunford

(12) 
(10) Patent No.: US 6,472,611 B1
(45) Date of Patent: *Oct. 29, 2002

(54) CONDUCTIVE PEDESTAL ON PAD FOR LEADLESS CHIP CARRIER (LCC) STANDOFF

(75) Inventor: Steven O. Dunford, Lewisville, TX (US)

(73) Assignee: Texax Instruments Incorporated, Dallas, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/229,622

(22) Filed: Jan. 13, 1999

Related U.S. Application Data

(60) Provisional application No. 60/073,667, filed on Feb. 4, 1998.

(51) Int. Cl.[7] .................................................. H05K 1/16
(52) U.S. Cl. ........................................ 174/260; 361/808
(58) Field of Search ................................. 174/260, 261; 361/767, 768, 769, 770, 771, 807, 808

(56) References Cited

U.S. PATENT DOCUMENTS

| | | | | |
|---|---|---|---|---|
| 4,963,002 A | * | 10/1990 | Tagusa et al. | 350/336 |
| 5,147,084 A | * | 9/1992 | Behun et al. | 228/56.3 |
| 5,929,521 A | * | 7/1999 | Wark et al. | 257/737 |
| 6,087,597 A | * | 7/2000 | Shimada et al. | 174/263 |

\* cited by examiner

Primary Examiner—Kamand Cuneo
Assistant Examiner—Jeremy Norris
(74) Attorney, Agent, or Firm—Frederick J. Telecky, Jr.; W. James Brady III

(57) ABSTRACT

A device and method for insuring the separation between a leadless chip carrier and printed wiring board, comprising aligning and attaching conductive pedestals to contact pads of either member and embedding the pedestals into the solder columns which are used to provide electrical connection. The conductive pedestals are comprised of an electrically conducting metal, solder, alloy or composite which will also provide thermal dissipation in selected designs.

10 Claims, 4 Drawing Sheets

CONDUCTIVE PEDESTAL ON PAD FOR LEADLESS CHIP CARRIER (LCC) STANDOFF

This application claims priority under 35 USC §119(e)(1) of provisional application No. 60/073,667, filed Feb. 4, 1998.

FIELD OF THE INVENTION

This invention relates to an improved method of surface mounting integrated circuit package, more specifically a leadless chip carrier, to a printed wiring board.

BRIEF DESCRIPTION OF THE PRIOR ART

This invention relates to an improvement in the surface mounting of an integrated circuit package, more specifically a leadless chip carrier, to a printed wiring board.

A leadless chip carrier is an integrated circuit package which includes a ceramic substrate on which there is provided a pattern of contact pads. A corresponding pattern of contact pads is provided on the printed wiring board. When the leadless chip carrier is mounted to the printed wiring board, the contact pads are electrically interconnected.

Various approaches to the mounting and electrical connection of the leadless chip carrier to printed wiring board have been proposed and implemented in the past. All of the known approaches are disadvantageous for one or more reasons. One approach is to provide a connector socket for receiving the leadless chip carrier on the printed wiring board. This approach is relatively expensive.

Another mounting approach is the use of a Chip Carrier Mounting Device (a trademark of Raychem Corp.) which is an array of high temperature solder wire leads having an embedded helical copper braid. The array is held in place by an dissolvable carrier which is temporary; the carrier being used to facilitate alignment of the wire leads to the contact pads of the leadless chip carrier. The carrier is removed after the leads are soldered to the leadless chip carrier. Disadvantages of this approach include the use of the temporary carrier which has a limited shelf life and is adversely affected by humidity. Additionally, this approach requires custom design which adds to the expense.

Another approach is the use of edge clips which are created from metal stampings and are available on continuous reels. The edge clips are intended to clip onto the edge of the leadless chip carrier using a spring retention mechanism. Some disadvantages are that they do not fit many leadless chip carrier package and they are frequently difficult to assemble to leadless chip carriers. Additionally, the use of edge clips results in excessively high stand off of the leadless chip carriers from the printed wiring board which reduces the packing density.

Yet another approach is the use of a lead wire array which provides pre-leading of a leadless chip carrier for subsequent solder assembly to a printed wiring board. The lead wire assembly is formed from a length of bare wire which is first bent into a planar serpentine shape. The bending results in a plurality of parallel segments which correspond to spacing of the contact pads. Portions of the parallel segments are flattened in order to provide a larger contact area for solder connection at the contact pads. The parallel segments in the first plane are then attached to the respective contact pads on the leadless chip carrier and the parallel segments in the second plane are attached to respective contact pads on the printed wiring board. The reversing segments of the wire are removed to eliminate short circuits between the contact pads. Some disadvantages of this technique are that it is labor intensive, results in an assembly that is difficult to clean and stand off devices are required to prevent collapse onto the printed wiring board.

The most widely used approach is to directly solder the contact pads of the leadless chip carrier to the contact pads of the printed wiring board. Since the leadless chip carriers have a ceramic substrate, they have a lower coefficient of thermal expansion than printed wiring boards which are typically used in the industry. Therefore unless the thermal expansion coefficient of the printed wiring board matches that of the leadless chip carrier, a reliability problem ensues as a result of excessive thermal-mechanical stresses placed on the solder joints. The use of component stand off devices to secure a separation of defined height has been shown to minimize the problem of thermal mismatch. This technique is used routinely. In this technique, solder masks are used to build stand off devices on the printed wiring board. Typically one stand off device per side of the leadless chip carrier is required and they must adhere to strict requirements for height, as well as for spacing between the stand off devices and contact connections. Fabrication of said solder mask devices is both time consuming and expensive.

SUMMARY OF THE INVENTION

It is the object of this present invention to provide an approach to control the separation between leadless chip carriers and printed wiring boards by forming stand off devices. Said devices are provided by mounting conductive pedestals within the contact pad areas. This approach is economical and does no have the disadvantages of the techniques described above.

In accordance with the present invention, there is provided a reliable, flexible and low cost method of assembly to control the separation between leadless chip carriers and printed wiring boards. This approach is used in conjunction with directly soldering the contact pads of the leadless chip carriers to the contact pads of the printed wiring boards. Such a separation is necessary to avoid overstressing the solder joints which provide electrical and mechanical connection between the two members. Further, this separation supports cleaning of fluxes or other contaminants which may deteriorate reliability and/or support formation of short circuits between contact areas. The foregoing and additional objects are attained by providing conductive pedestals within the solder pad area. The conductive pedestal comprises an electrically conductive material of controlled dimensions which set the stand off height. Further, the conductive pedestals retain standoff dimensions within the specification during and subsequent to the solder reflow process. Volume of the conductive pedestal is small with respect to that of the solder column which connects the chip carrier and printed circuit board and does not significantly alter the properties of said connectors. Said pedestal is compatible with the solder used for connecting the contacts of the leadless chip carrier and those of the printed wiring board.

The conductive pedestals are attached to contact pads of either the leadless chip carriers or to those of the printed wiring boards prior to embedding in the connecting solder columns.

In order to maintain the required coplanarity between chip carrier and board, conductive pedestal size is controlled, and the pedestals must be located so that the package will be maintained parallel to the printed wiring board; typically at least one conductive pedestal is necessary on each side of the package. Additional pedestals provide redundancy which can further insure control of the stand off height coplanarity.

Further, because the conductive pedestals are contained within the area of the solder column, they add no interference for cleaning between the connectors, but they do aid in the cleaning efficiency as a result of the standoff provided between chip carrier and board.

Solders, alloys, metals or composites which are conductive are acceptable materials for conductive pedestals, so long as they are compatible with eutectic solder and maintain dimensional stability during solder reflow.

The invention herein comprises a method to transfer conductive pedestals to the contact pads. The precise location of the small pedestals on the contact pads is not critical. One method which is readily automated, high speed, low cost and is compatible with current manufacturing techniques provides for transfer of preformed spheres.

The spheres when attached to contact pads form conductive pedestals. This method comprises forming an array of patterned areas which register to a location for conductive pedestals. One conductive pedestal sphere is captured per area and retained until the spheres are aligned to the receiving pads. The preferred method for forming the patterned arrays provides a photoimagable adhesive coated on a transparent carrier film. One metal or alloy sphere is captured in each tacky areas and retained until the spheres are aligned on the receiving contact pads. Upon heating, the adhesive loses tackiness and the pedestals are affixed to the receiving pad by techniques such as reflowing of solder, alloy or composites such as polymers filled with metal.

A suitable film with photosensitive adhesive to form tacky patterned areas is available from E. I. duPont de Nemours & Company. The use of such a transfer method has been disclosed previously in U.S. Pat. No. 5,356,751 and is incorporated herein by reference. The specific application of a small conductive standoff within a much larger conductor area for the purpose of providing standoff is novel.

Alternate technique for transfer of such spheres has been demonstrated, such as by patterning an array of dimples in an film which will not wet to solder, capturing a sphere of solder in each dimple, aligning the pattern to the contact pads and reflowing onto the contact pads. Still other techniques may be used to align and attach preformed conductive pedestals to the conductor pads.

Conductive pedestals attached to either the leadless chip carrier or the printed wiring board do not alter the normal manufacturing procedure for direct solder connection. Contacts on the printed wiring board are covered with solder paste, the component aligned and placed by conventional techniques and the solder is reflowed by the existing manufacturing procedure.

A further application of the conductive pedestal stand off device comprises populating thermal pads of leadless chip carriers in the same operation as forming conductive pedestals. Thermal pads are not electrically connected; they are typically located in the center of the package, directly under the integrated circuit and are provided in an attempt to dissipate heat into the printed wiring board. Owing to the small size and placement accuracy provided, pedestals which support heat dissipation are readily forming using the same devices, methods and at the same time as those for conductive pedestal stand off devices.

The use of conductive pedestals embedded within solder columns which connect leadless chip carriers to printed wiring boards differs from ball grid array connections in that (1) only one pedestal per package side is required, (2) pedestals are not the primary electrical or mechanical connection, but instead becomes a part of said connection and (3) placement of said pedestals is not critical as long as they are within the contact pad areas. Further, conductive pedestals embedded within solder columns differs from Chip Carrier Mounting Devices for the same reasons as those for ball grid arrays, but also a less complex and more reliable assembly process is provided.

DESCRIPTION OF THE PREFERRED EMBODIMENT

Figure 1A:
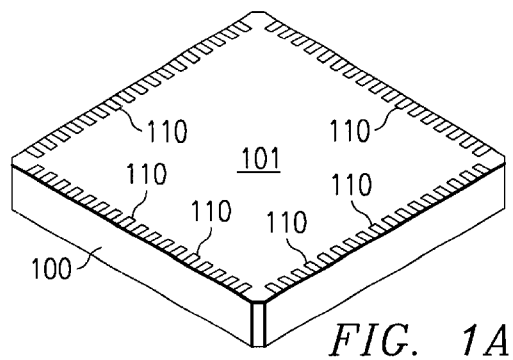
FIG. 1A is a perspective view of a leadless chip carrier showing typical pattern of contact leads.
Figure 1B:
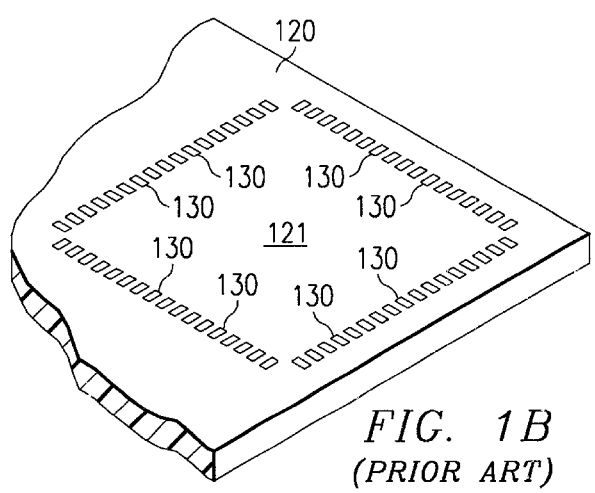
FIG. 1B is a perspective view of a portion of a printed wiring board showing corresponding pattern of contact pads.

Referring to the drawings, FIG. 1A shows a typical leadless chip carrier 100 which includes a ceramic substrate with a major surface 101. On the surface 101 is a pattern of contact pads 110 which typically extend along the edges of the surface 101. FIG. 1B shows a portion of a printed wiring board 120 to which the leadless chip carrier 100 is to be mounted. The printed wiring board 120 has a major surface 121 on which there is a pattern of contact pads 130 corresponding to the pattern of contact pads 110.

Figure 2:
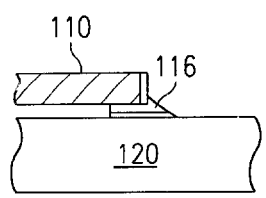
FIG. 2 illustrates a cross sectional view of a prior art leadless chip carrier with contact pads directly soldered to the contact pads of a printed wiring board.

FIG. 2 illustrates a cross sectional view of the direct soldering of contact pads 110 of the leadless chip carrier 100 to the contact pads 130 of the printed wiring board 120. Because the printed wiring board 120 has a much higher coefficient of thermal expansion than that of the ceramic leadless chip carrier 100, thermally induced mechanical stresses are placed on the solder joints which may result in failures. Such stresses can be minimized by making the circuit board 120 and chip carrier 100 of similar materials. However, this would make a very expensive circuit board if the board were to be made of ceramic. On the other hand, if the leadless chip carrier package were made of circuit board composition, it would negate the choice for a reliable ceramic package.

Figure 1C:
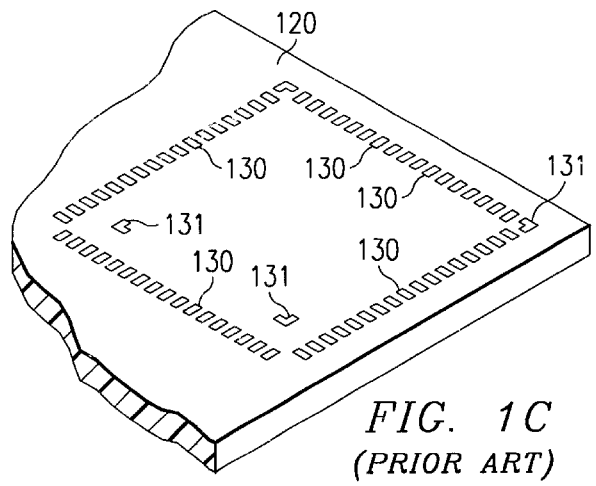
FIG 1C is perspective view of a portion of a printed wiring board with contact pads and solder mask stand off devices.

In actual practice, the fatigue life of solder joints has been enhanced by increasing the height of the solder columns 116 which connect the leadless chip carrier 100 and printed circuit board 120. The most widely used approach for insuring controlled height of the solder columns 116 has been to form stand off devices 131 on the printed wiring board as shown in FIG. 1C. One common technique for forming the stand off devices 131 is by patterning and etching solder mask material on the printed wiring board 120. The solder mask stand off process is both time consuming and expensive. Chemical usage and waste disposal add to the expense of this labor intensive process. Typically the solder mask stand off devices 131 are 0.007 to 0.010 inches in height and are formed in two steps, each step adding approximately 0.004 inches and requiring 2 to 4 hours per step. Typically there is one such device is formed at or near the corner of each contact pattern array 110 as is illustrated in FIG. 1C. Separation between leadless chip carrier 100 and printed wiring board 120 is required not only to minimize solder joint fatigue, but also to facilitate cleaning flux and other contaminants. It can be seen from the illustration of solder mask stand off devices 131 that these devices do occupy space on the board and can inhibit the flow of cleaning solutions.

Figure 3:
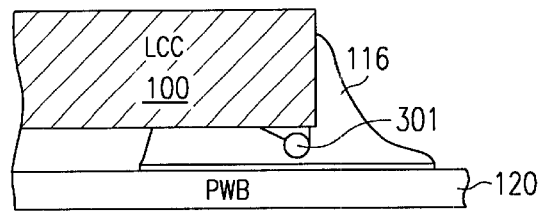
FIG. 3 illustrates a cross sectional view of a leadless chip carrier with conductive pedestal stand off devices directly solder to the contact pads of a printed wiring board.

According to this invention, a stand off device is provided as illustrated in FIG. 3, wherein a conductive pedestal 301 is embedded in the solder column 116. Said conductive pedestal 301 serves to control stand off between the leadless chip carrier 100 and printed wiring board 120, and because it is contained within the area of the solder column itself, it does not occupy additional space on the board and therefore does not interfere with cleaning processes.

To further explain the conductive pedestal stand off device 301 and its use, some requirements on the leadless chip carrier should be understood. The contact pads 110 of leadless chip carrier devices are relatively large in order to assure good contact; i.e., typically the pads are in the range of 0.025 by 0.050 inches. The minimum separation requirement between carrier 100 and board 120 is 0.008+0.002/−0.001 inches from bare laminate board; however, reliability improvement has been shown if the height of the solder column 116 is controlled at the high end of that specification. The maximum separation is defined by the stencil used to screen solder paste on the printed wiring board contact pads 130.

A conductive pedestal 301 comprises an electrically conductive material of controlled height to meet this specification and which is compatible with the eutectic solder of the solder column 116. Spheres of conductive metals or alloys are readily available with controlled diameter of 0.008 to 0.010 inches and which can be attached to contact pads to form conductive pedestals. Attachment techniques are by solder or alloy reflow, or by conductive adhesives. The conductive pedestals 301 are subsequently embedded within the solder column 116 to form stand off devices. Several metals, composites and alloys or solders meet these requirements.

In the preferred embodiment, the conductive pedestal 301 is formed from 10 Sn/90 Pb solder spheres which reflow at a higher temperature than the eutectic 37 Sn/37 Pb used in the solder column 116. Liquidus temperature of 10 Sn/90 Pb is near 300 deg C., whereas that of 37 Sn/63 Pb is 183 deg C. Attachment temperature of the higher melting 10 Sn/90 Pb solder in controlled so that a bond to the contact pad is accomplished, but the sphere retains approximately eighty percent of its height; i.e. the sphere with starting diameter of 0.010 inches will provide an approximate stand off height of 0.008 inches. Further, due to the higher melting temperature of the 10 Sn/90 Pb solder, it maintains the stand off height requirement during reflow of the eutectic solder to the printed wiring board.

The solders are completely compatible so that no separation between the materials is created by dewet during assembly processing. The volume of conductive pedestal 301 is small in comparison with that of the solder column 116 so that it does not significantly alter the electrical, thermal or mechanical properties of said connecting column. In the preferred embodiment, 10 Sn/90 Pb solder spheres 0.008 to 0.010 inches in diameter form the conductive pedestals which are embedded in eutectic solder columns of typical dimensions 0.025 by 0.050 by 0.009 inches. The material choice is not limited to this selection.

Figure 4A:
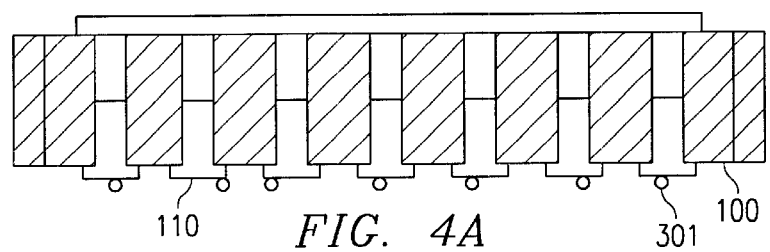
FIG. 4A, 4B and 4C illustrate cross sectional views of leadless chip carrier with conductive pedestals attached before and after attachment to a printed wiring board.
Figure 4B:
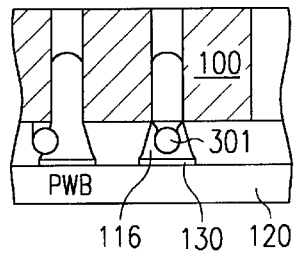

FIG. 4A is a cross sectional view of leadless chip carrier 100, showing contact pads 110 and conductive pedestals 301 attached to the pads. FIG. 4B is a cross-sectional view of carrier 100 attached to printed wiring board 120 by means of solder column 116, pad 130, and pedestals 301.

Figure 4C:
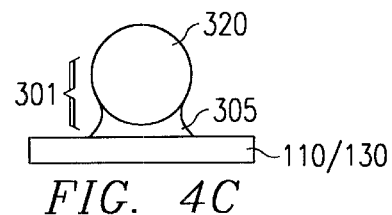

FIG. 4C is an enlarged view of pedestals 301, including spheres 320 and solder 305 including spheres 320 and solder 305.

Figure 5A:
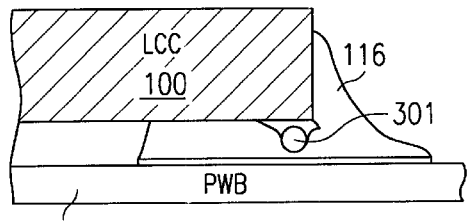
FIG. 5A depicts a conductive pedestal which was attached to a leadless chip carrier Vs 5B in which the pedestal was attached first to a printed wiring board.
Figure 5B:
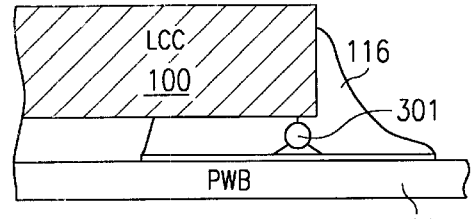

The simple design constraints for location of conductive pedestals are depicted in FIG. 5A, 5B, 6 and 7. It can be seen from FIG. 5A and 5B that the conductive pedestal 301 can be formed by attaching spheres to either the leadless chip carrier 100 as shown in FIG. 5A or to the printed wiring board 120 as shown in FIG. 5B. Shape of the fillet at the contact pad is the detectable difference, but there is no effect on the finished device. If the conductive pedestal is attached to the leadless chip carrier, the attachment process is carried out after electrical testing of the device in order to avoid any change in the expensive test fixturing. Simple visual inspection for pedestal presence is the only requirement. Alternately the conductive pedestals 301 can be attached to the printed wiring board 120 as shown in FIG. 5B. Potential advantages to this option are that the pedestals for more than one leadless chip carrier can be processed in a single operation, and this would be particularly advantageous for high volume production circuits. This choice will remain an option for the user.

Figure 6:
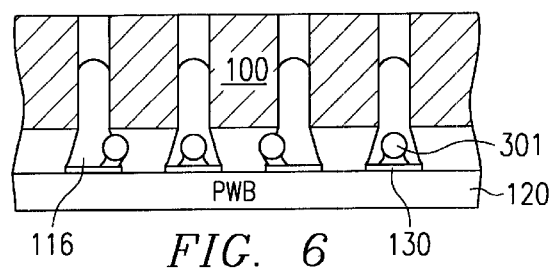
FIG. 6 illustrates the noncriticality of conductive pedestal placement within the pad area.

From FIG. 6 it can be seen that precise placement of conductive pedestal is not critical. The contact pad 110 or 130 is large with respect to the conductive pedestal 301 and as long as the pedestal is within that pad area, the necessary functions of height separation by conductive pedestal is fulfilled. This feature allows latitude in the manufacture of said devices.

Figure 7A:
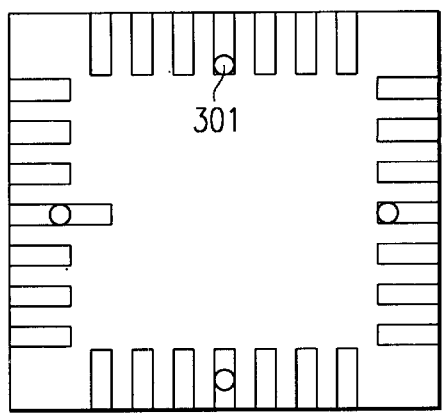
FIG. 7 depicts some options for population of contact pads with conductive pedestals.
Figure 7B:
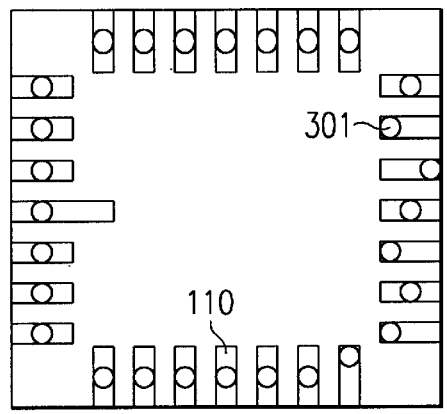
Figure 7C:
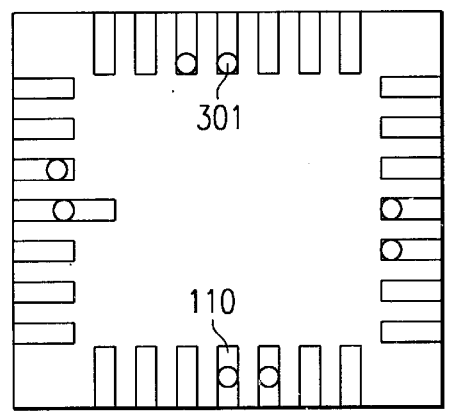

FIG. 7A shows that conductive pedestals can be placed on a single pad per side of the contact pads 110 or 130, whereas FIG. 7B shows pedestals fully populating each contact pad, and FIG. 7C shows an array of pedestals with one redundant pedestal per side of the pads. The preferred embodiment provides redundancy, as in FIG. 7C, but avoids expectation that the pedestals form the primary means of electrical connection. However, any combination of these options is acceptable so long as the minimum number and location of pedestals are provided to meet the coplanarity requirements of the device.

Figure 8A:
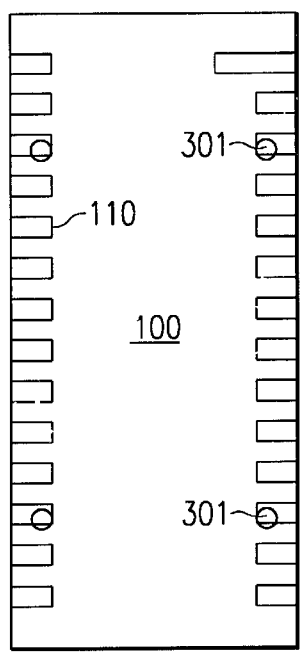
FIG. 8 depicts placement of conductive pedestals on alternate shape chip carrier packages.
Figure 8B:
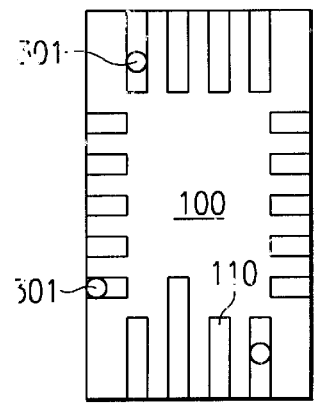
Figure 9A:
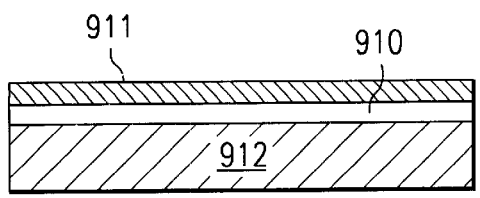
FIG. 9 illustrates the processing steps for attachment of conductive spheres by the tacky dot transfer method.
Figure 9E:
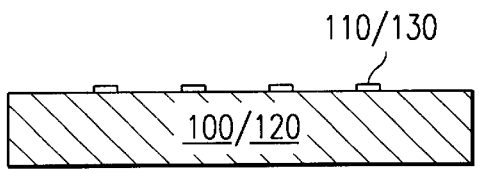
Figure 9B:
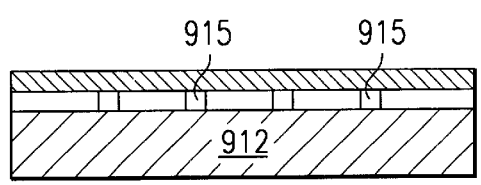
Figure 9F:
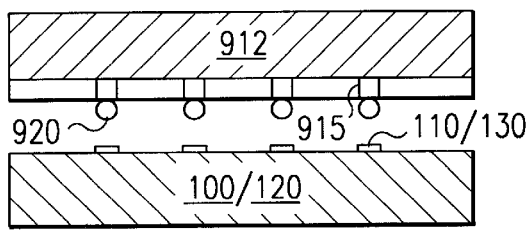
Figure 9C:
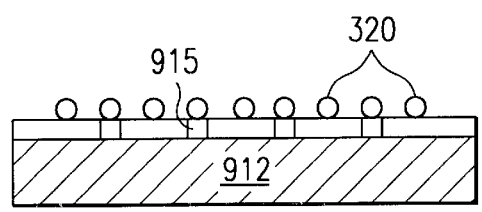
Figure 9G:
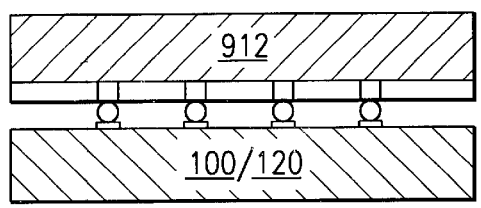
Figure 9D:
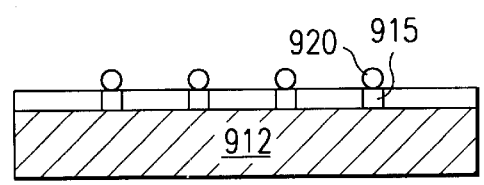
Figure 9H:
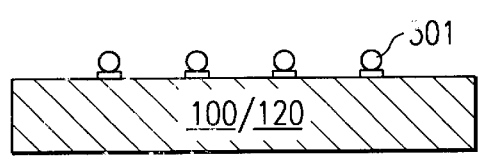

Continuing with the design options for conductive pedestal stand off devices, it can be seen from FIG. 7 and 8 that different shapes of leadless chip carrier packages 100 will logically require that the layout of the stand off pedestals be modified; i.e., the rule of a minimum of one pedestal 301 per side would not be acceptable to the package with leads on two sides only as in FIG. 8A, but instead that two or more pedestals must be placed on the long side. Alternately, on very small leadless chip carriers 100, as in FIG. 8B, coplanarity can be satisfied by pedestals 301 on three sides. Again, these options will be managed by the user and those versed in the art will understand and will find the latitude of this design beneficial.

In summary design constraints for conductive pedestal stand off devices are as follows: a conductive material which is compatible with solder of controlled size which will be maintain height during reflow processing, and of small volume so as not to alter the properties of the solder column connection. Location of the pedestals within the contact pad is not critical, attachment can be to either the leadless chip carrier or printed wiring board and the number of columns required is determined by coplanarity.

Turning now to the method for forming conductive pedestal stand off devices 301. A reliable, flexible, low cost process which is compatible with high volume manufacturing is provided for aligning and attaching conductive pedestals to the selected contact pads 110 or 130. The process provides for forming an array of patterned areas which register to the locations for conductive pedestals. One conductive pedestal is captured per area and retained until they are aligned to the receiving contact pads 110 or 130. The preferred method for forming the patterned arrays and attaching to the contact pads is depicted by the process flow in FIG. 9. In step 1 there is provided a photopolymer adhesive coating on a 0.003 inch thick polyimide film. In step 2 of FIG. 9, an array of tacky or sticky areas is formed in the adhesive by placing a phototool over the coating and then exposing the coating to a dose of ultraviolet radiation. Those areas protected by the phototool remain tacky while those areas exposed to the radiation lose their adhesiveness. The tacky areas formed register to the pattern of contact pads selected for conductive pedestals. A Mylar cover sheet is removed and an excess of spheres which will form the conductive pedestals are loaded onto the film. One sphere is retained by each of the sticky areas as in step 3. In the preferred embodiment, 10 Sn/90 Pb solder spheres are 0.008 to 0.10 inches in diameter. Excessive and unwanted spheres are removed mechanically in step 4. The populated film is now ready to be aligned to the contact pads 110 or 130.

Fluxing is commonly used with solder reflow processing in order to provide clean surfaces which will readily be wet by solder. In such case, flux is applied to either the spheres or to the contact pad surfaces as in step 5. The spheres are aligned over the contact pads as shown in step 6 before the film is lowered. Upon heating or exposure to ultraviolet light the adhesive loses tackiness and in the preferred embodiment, solder reflow releases the spheres from the film and metallurgically attaches them to the receiving contact pads 110 or 130 as in step 7. In step 8, the polyimide film is removed from the assembly. These steps complete attaching a conductive pedestals to selected contact pads of either the leadless chip carrier or printed wiring board.

The next steps in forming conductive pedestal stand off devices is provided in the assembly of leadless chip carriers to a printed wiring board. In these steps the conductive pedestals, previously attached to said contact pads are embedded in the solder columns which connect the two circuits electrically and mechanically. All contact pads of the leadless chip carrier are directly soldered to those of the printed wiring board. Typically this process involves applying a solder paste to all contact pads of the printed wiring board through apertures in a stencil. The leadless chip carrier components are aligned and placed with automated pick and place equipment. Contact pads with conductive pedestals are processed in precisely the same manner as those with no pedestals and the processing equipment requires no changes. Solder reflow is carried out using conventional convection or infrared furnaces with predefined ramp rates and temperatures to accomplish reflow and cooling. The existence of conductive pedestals on some contact pads does not alter this process.

Conductive pedestal devices of the preferred embodiment were been tested on 28 pin leadless chip carriers and compared to use of stand off formed by solder mask processing. Test conditions were temperature cycling from −55 to 125 deg C. with 30 minute dwell at temperature. Solder joint integrity was monitored by an event detector and the tests carried out to 50% failure. Failure mechanisms of the solder joints were analyzed by cross sectioning and inspecting by scanning electron microscope. The results found that the conductive pedestal devices were statistically as reliable as those formed by solder mask pedestals and no difference in failure mechanisms were detected. Cycle time reduction shows a 70% improvement for the conductive pedestal process, even in a development stage as compared to the solder mask pedestal technique in a mature stage.

Figure 10:
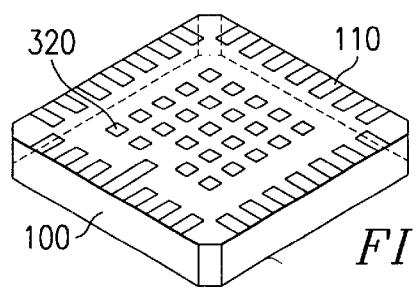
FIG. 10 illustrates a leadless chip carrier with thermal pads.

A further embodiment comprises populating thermal pads of leadless chip carriers by the same methods as those described forming the conductive pedestals. Further, thermal pads can be connected during the same operation as the conductive pedestals, but it is also possible to use this technique for heat dissipation without the conductive pedestal stand off devices. Thermal pads are not electrically connected, but are provided in an attempt to dissipate heat from the leadless chip carrier into the printed wiring board. Thermal pads frequently are provided in the central area of the package, as is shown in FIG. 10. Owing to the small size and placement accuracy provided by the process detailed for conductive pedestal formation, thermal pads will be populated with thermally conductive spheres. Many materials, including the 90 Sn /10 Pb solder of the preferred embodiment provide good thermal conductivity and are acceptable choices. Similarly, connection to the board is preferably by soldering with eutectic solder, as with the stand off devices, but any thermally conductive material is acceptable to provide heat dissipation because an electrical connection is not required.

What is claimed is:

1. A device formed on selected contact pads to assure a controlled separation between a leadless chip carrier attached to a printed wiring board comprising:
   a) conductive pedestals located within selected contact pad areas, the number and distribution of pedestals being only sufficient to achieve coplanarity between said carrier and said board,
   b) said pedestals attached to said contact pads, and
   c) said pedestals wholly incorporated into the solder connection between carrier and wiring board.

2. A device as in claims 1 wherein the volume of the conductive pedestal is so small with respect to the solder connection so that it does not significantly alter the electrical properties of said connection.

3. A device as in claim 1 wherein said conductive pedestals are of controlled size to meet specifications for separation height.

4. A device as in claim 1 wherein said conductive pedestals are of sufficiently uniform size, and number, and which are located to maintain coplanarity requirements.

5. A device as in claim 1 wherein said conductive pedestals are comprised of a solder, metal or composite which is compatible with solder.

6. A device as in claim 1 wherein said conductive pedestal maintains separation space within specifications after exposure to solder reflow processing.

7. A device as in claim 1 wherein said conductive pedestals are attached to the contact pads of either the leadless chip carrier or those of the printed wiring board.

8. A device as in claim 1 wherein said conductive pedestal is incorporated within the solder connections so that there is no loss of space between the solder connections.

9. A device as in claim 1 wherein said pedestal is compatible with conventional printed circuit board assembly techniques.

10. A device formed on selected contact pads to assure a controlled separation between a leadless chip carrier attached to a printed wiring board comprising:

a) conductive pedestals located within said selected contact pad areas, b) said pedestals attached to contact pads, and c) said pedestals incorporated into the solder connection between carrier and wiring board so that there is no loss of space of the board, and d) the volume of the conductive pedestal is small with respect to the solder connection so that it does not significantly alter the properties of said connection, and e) said conductive pedestals are of controlled size to meet specifications for separation height and, f) said conductive pedestals are of sufficiently uniform size, and only sufficient in number and location to maintain coplanarity specifications, and g) said conductive pedestals are comprised of a solder, metal or composite which is compatible with solder, and h) said conductive pedestals are sufficiently stable to maintain separation height within specifications after thermal exposure to solder reflow processing, and i) said conductive pedestals are attached to the contact pad area of either the leadless chip carrier or those of the printed wiring board.

* * * * *